(12) United States Patent
Anai et al.

(10) Patent No.: US 12,046,572 B2
(45) Date of Patent: Jul. 23, 2024

(54) BONDING SHEET AND BONDED STRUCTURE

(71) Applicant: Mitsui Mining & Smelting Co., Ltd., Tokyo (JP)

(72) Inventors: Kei Anai, Ageo (JP); Jung-Lae Jo, Ageo (JP)

(73) Assignee: Mitsui Mining & Smelting Co., Ltd. (JP)

( * ) Notice: Subject to any disclaimer, the term of this patent is extended or adjusted under 35 U.S.C. 154(b) by 0 days.

(21) Appl. No.: 17/793,161

(22) PCT Filed: Mar. 12, 2021

(86) PCT No.: PCT/JP2021/010065
§ 371 (c)(1),
(2) Date: Jul. 15, 2022

(87) PCT Pub. No.: WO2021/187362
PCT Pub. Date: Sep. 23, 2021

(65) Prior Publication Data
US 2023/0005871 A1    Jan. 5, 2023

(30) Foreign Application Priority Data
Mar. 19, 2020  (JP) ................................ 2020-050001

(51) Int. Cl.
*H01L 23/00* (2006.01)
*B32B 15/01* (2006.01)
(Continued)

(52) U.S. Cl.
CPC ............ *H01L 24/29* (2013.01); *B32B 15/018* (2013.01); *C09J 1/00* (2013.01); *C09J 7/28* (2018.01);
(Continued)

(58) Field of Classification Search
CPC .................... H01L 24/29; H01L 24/30; H01L 2224/29083; H01L 2224/29147
See application file for complete search history.

(56) References Cited

U.S. PATENT DOCUMENTS

| 2006/0105193 A1* | 5/2006 | Burger .................. B23K 35/00 428/654 |
| 2019/0244888 A1 | 8/2019 | Kawashima |
| 2021/0138541 A1* | 5/2021 | Anai ........................ B22F 1/10 |

FOREIGN PATENT DOCUMENTS

| EP | 3950175 A1 | 2/2022 | |
| JP | 2015090900 A * | 5/2015 | ............. H01L 24/32 |

(Continued)

OTHER PUBLICATIONS

English translation of JP2015-090900 obtained form EPO espacenet dated Mar. 3, 2024. (Year: 2024).*

(Continued)

*Primary Examiner* — Adam Krupicka
(74) *Attorney, Agent, or Firm* — Harness, Dickey & Pierce, P.L.C.

(57) ABSTRACT

A bonding sheet includes a copper foil and sinterable bonding films formed on both faces of the copper foil. The bonding films each contain copper particles and a solid reducing agent. The bonding sheet is used to bond to a target object to be bonded having at least one metal selected from gold, silver, copper, and nickel on a surface thereof. A bonded structure includes: a bonded object having at least one metal selected from gold, silver, copper, and nickel on a surface thereof; a copper foil; and a bonding layer including a sintered structure of copper particles; and the bonded object and the copper foil are electrically connected to each other via the bonding layer.

7 Claims, 3 Drawing Sheets

(51) Int. Cl.
*C09J 1/00* (2006.01)
*C09J 7/28* (2018.01)
*B22F 7/08* (2006.01)
*H01L 23/373* (2006.01)

(52) U.S. Cl.
CPC ............... *H01L 24/83* (2013.01); *B22F 7/08* (2013.01); *C09J 2203/326* (2013.01); *C09J 2400/163* (2013.01); *H01L 23/3735* (2013.01); *H01L 23/3736* (2013.01); *H01L 2224/29083* (2013.01); *H01L 2224/29147* (2013.01); *H01L 2224/29293* (2013.01); *H01L 2224/29347* (2013.01); *H01L 2224/83439* (2013.01); *H01L 2224/83444* (2013.01); *H01L 2224/83447* (2013.01); *H01L 2224/83455* (2013.01)

(56) References Cited

FOREIGN PATENT DOCUMENTS

| | | |
|---|---|---|
| JP | 2018-103189 A | 7/2018 |
| JP | 2019-203172 A | 11/2019 |

OTHER PUBLICATIONS

International Search Report (English and Japanese) issued in PCT/JP2021/010065, mailed Apr. 27, 2021; ISA/JP (5 pages).

\* cited by examiner

BONDING SHEET AND BONDED STRUCTURE

CROSS REFERENCE TO RELATED APPLICATIONS

This application is a U.S. National Phase Application under 35 U.S.C. 371 of International Application No. PCT/JP2021/010065, filed on Mar. 12, 2021, which claims priority to Japanese Patent Application No. 2020-050001, filed on Mar. 19, 2020. The entire disclosures of the above applications are expressly incorporated by reference herein.

BACKGROUND

Technical Field

The present invention relates to a bonding sheet and a bonded structure.

Related Art

Along with a recent worldwide trend toward energy conservation, semiconductor devices called power devices are increasingly used as power conversion/control devices such as inverters. In order to enhance the efficiency of semiconductor elements and achieve space-saving, an electronic component called a power module is used. The power module is configured such that a plurality of semiconductor elements are provided on a metal ceramic substrate, and that a metal layer and a metal wire are provided on the upper surfaces of the semiconductor elements.

For the purpose of improving the electrical conduction reliability of the power module, US 2019/244888A1 discloses a semiconductor device that includes a first conductive plate, a plurality of semiconductor chips disposed on the first conductive plate, and a first external connection terminal connected to the first conductive plate. US 2019/244888A1 also discloses that, in the semiconductor device, the plurality of semiconductor chips are soldered.

However, in the semiconductor device disclosed in US 2019/244888A1, solder with low thermal conductivity is used as a bonding material. Accordingly, heat generated when the power module is operated cannot be sufficiently dissipated, which may lead to a malfunction of the module. In addition, the solder melts due to the heat generated when the power module is operated, which may impair the electrical conduction reliability.

Accordingly, it is an object of the present invention to provide a bonding sheet and a bonded structure that are excellent in thermal conductivity and electrical conduction reliability.

SUMMARY

The present invention provides a bonding sheet including: a copper foil; and sinterable bonding films formed on both faces of the copper foil, wherein each of the bonding films contains copper particles and a solid reducing agent, and the bonding sheet is used such that at least one of the bonding films is bonded to a target object to be bonded, the target object having at least one metal selected from gold, silver, copper, and nickel on a surface thereof.

Furthermore, the present invention provides a bonded structure including: a first bonded object having at least one metal selected from gold, silver, copper, and nickel on a surface thereof a second bonded object having at least one metal selected from gold, silver, copper, and nickel on a surface thereof; and a bonding layer including a sintered structure of copper particles, the first bonded object and the second bonded object being electrically connected via the bonding layer; wherein a structure (3) below is formed in the bonding layer,

[Chem. 1]

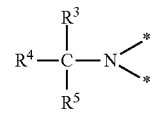

(3)

where $R^3$ to $R^5$ each independently represent a hydrogen atom, a hydroxyl group, a hydrocarbon group having 1 to 10 carbon atoms, or a hydrocarbon group having 1 to 10 carbon atoms and a hydroxyl group, and * represents a linkage site to copper.

DETAILED DESCRIPTION

Figure 1:
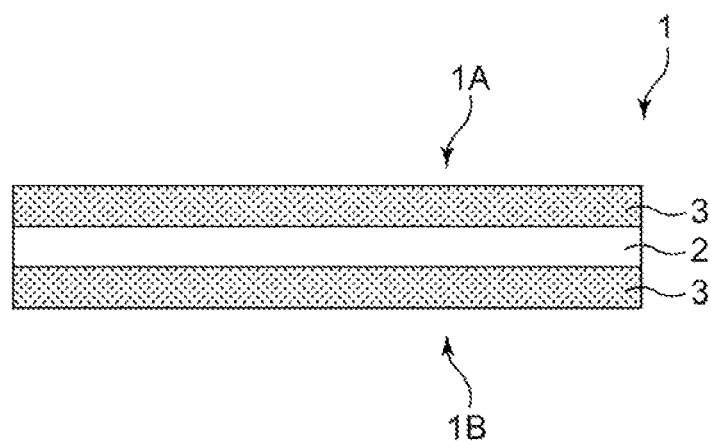
FIG. 1 is a side view schematically illustrating a bonding sheet according to an embodiment.

Hereinafter, the bonding sheet and the bonded structure according to the present invention will be described based on preferred embodiments thereof. As shown in FIG. 1, a bonding sheet 1 includes a copper foil 2 and bonding films 3 formed on both faces, respectively, of the copper foil 2. Each of the bonding films 3 contains copper particles and a solid reducing agent.

The bonding sheet 1 is favorably used so as to bond to a target object 5 to be bonded, the target object 5 having at least one metal selected from gold, silver, copper, and nickel on the surface thereof (hereinafter, the target object 5 to be bonded is also referred to simply as "bonding target"). Also, in the bonding sheet of the present invention, the bonding films 3 are formed on both faces, respectively, of the copper foil 2, and thus the bonding sheet 1 may be used such that the bonding sheet 1 is interposed between two bonding targets 5 to bond the bonding targets 5 to the faces of the bonding films 3, respectively. The metal present on the surface of each bonding target 5 may be in the form of, for example, a metal layer on the surface of the bonding target 5.

Each of the bonding films 3 of the bonding sheet 1 is sinterable. As used herein, the term "sinterable" refers to the following state of copper particles: the copper particles are present in the bonding film 3 without being fused to each other, and by sintering the copper particles present in the bonding film 3, a sintered body having a sintered structure of the copper particles fused to each other can be formed. By heating the bonding films 3 of the bonding sheet 1 and the bonding targets 5 preferably under pressure, the copper foil 2 of the bonding sheet 1 can be bonded to the bonding targets 5.

Figure 2A:
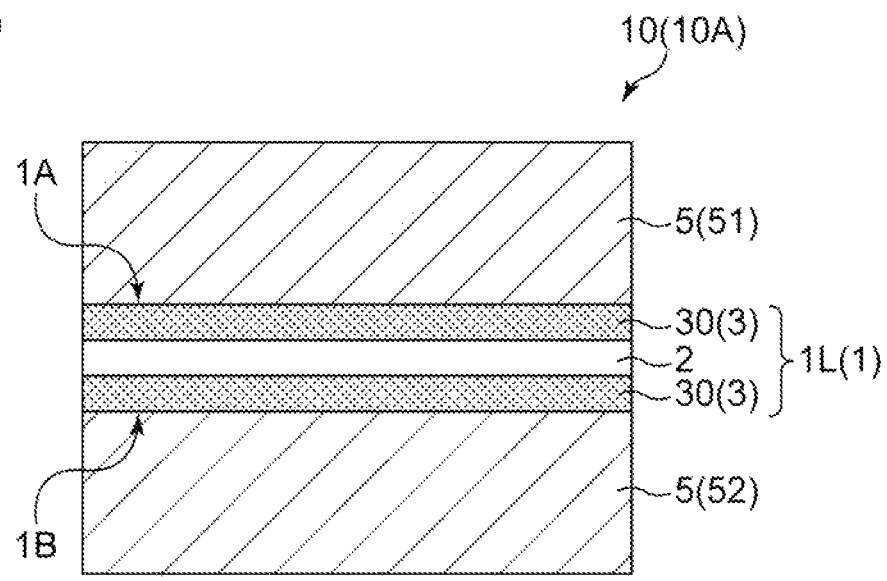
FIG. 2(a) is a side view schematically illustrating a bonded structure according to an embodiment.
Figure 2B:
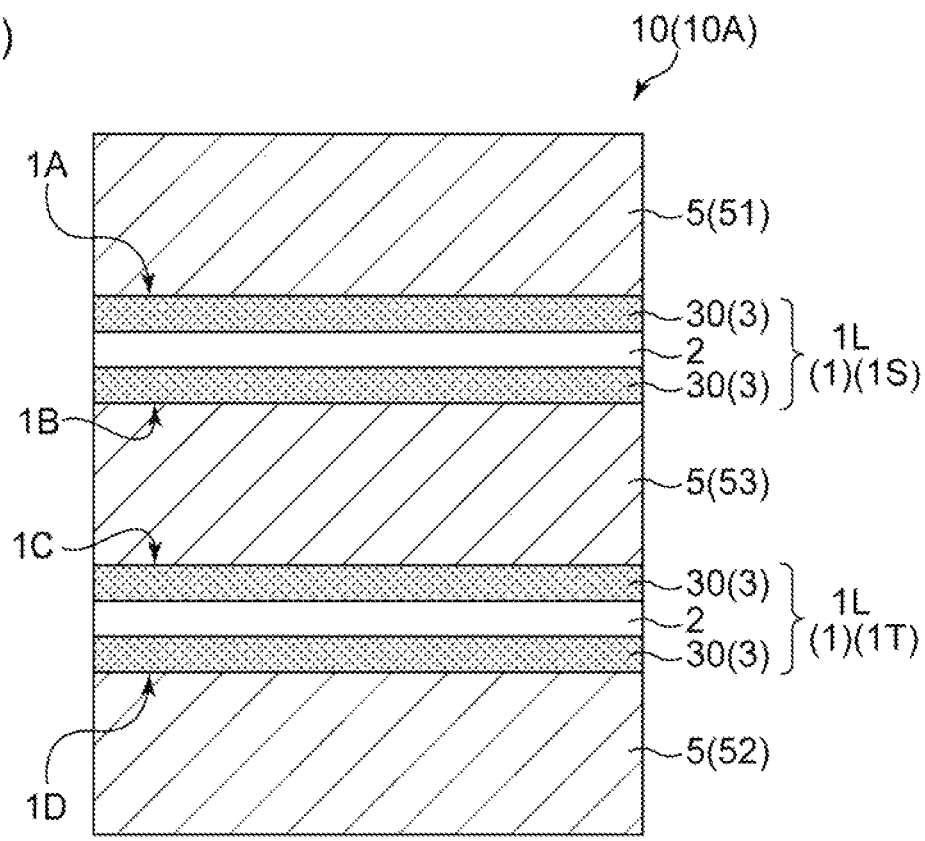
FIG. 2(b) is a side view schematically illustrating a bonded structure according to another embodiment.

As shown in FIGS. 2(a) and 2(b), each of the bonding films 3 after heating is a conductive bonding layer 30 having a sintered structure of copper particles. The bonding layers 30 bond and electrically connect the copper foil 2 to the two bonding targets 5. The bonding sheet 1 can be obtained using, for example, a production method described later.

The copper foil 2 of the bonding sheet 1 is a copper foil composed of copper and inevitable impurities as the balance, or a copper foil made of a copper alloy containing copper and a metal other than copper.

In view of achieving both the strength of the copper foil and the electro-conductivity of the bonded structure, the copper foil 2 contains copper in an amount of preferably 97 mass % or more, more preferably 99 mass % or more, and even more preferably the copper foil 2 is composed of copper and inevitable impurities as the balance.

From the same viewpoint, the copper foil has a thickness of preferably 0.5 μm or more and 1000 μm or less, and more preferably 1 μm or more and 500 μm or less. The thickness of the copper foil can be measured by, for example, observing a cross section of the bonding sheet in the thickness direction with a scanning electron microscope.

As shown in FIG. 1, the bonding films 3 of the bonding sheet 1 may be formed on the entirety of both faces of the copper foil 2. Alternatively, one of the bonding films 3 of the bonding sheet 1 may be discontinuously formed on one of the faces of the copper foil 2, and the other bonding film 3 may be formed on the entirety of the other face of the copper foil 2. Alternatively, the bonding films 3 of the bonding sheet 1 may be discontinuously formed on both faces of the copper foil 2. In the case where the bonding film 3 is discontinuously formed on a face of the copper foil 2, the copper foil 2 is exposed in the area(s) where the bonding film 3 is not formed.

As shown in FIG. 1, it is preferable that no solid layer be present between the copper foil 2 and each of the bonding films 3 in the bonding sheet 1.

As shown in FIG. 1, it is preferable that no other solid layer be present on a first face 1A or a second face 1B of the bonding sheet 1. Examples of the other solid layer include an additional copper foil and an additional bonding film.

However, another solid layer may be present on at least one of the faces of the bonding sheet 1 as long as the advantageous effects of the present invention are exhibited.

The copper particles contained in the bonding films 3 may be, for example, in any of the following modes: (i) copper particles consisting of copper and inevitable impurities as the balance; (ii) copper particles made of a copper alloy containing copper and a metal other than copper; and (iii) a mixture of the copper particles (i) and the copper particles (ii). In the present invention, the copper particles in any of these modes are collectively referred to simply as "copper particles". Also, depending on the context, the term "copper particles" may be used to exactly refer to copper particles, or a copper powder, which is an aggregate of copper particles.

In view of improving both thermal conductivity and electro-conductivity, the copper particles contain copper in an amount of preferably 50 mass % or more, more preferably 70 mass % or more, and even more preferably 90 mass % or more, with inevitable impurities as the balance. Also, from the same viewpoint, the mode of the copper particles is preferably an aggregate of (i) copper particles consisting of copper and inevitable impurities as the balance. In the case where the aggregate of the copper particles contains a plurality of types of particles, the copper content is calculated based on all copper particles.

The solid reducing agent contained in the bonding films 3 is in the form of a solid at 1 atm pressure and room temperature (25° C.), and is used to facilitate sintering of the copper particles caused by heating the bonding films 3. For this purpose, it is advantageous that the solid reducing agent have a chemical structure that contains at least one amino group and a plurality of hydroxyl groups. By using a reducing agent with such a structure, oxidation of the copper particles during sintering can be suppressed, as compared with the case where a reducing agent that contains a plurality of hydroxyl groups and no amino group is used, and a dense sintered structure can thus be obtained due to the furtherance of sintering of copper particles. As a result, it is possible to obtain a bonded structure that has high thermal conductivity and electrical conduction reliability. The expression "solid at room temperature (25° C.)" means that the melting point of the solid reducing agent is above 25° C.

The melting point of the solid reducing agent is preferably 300° C. or less. The boiling point of the solid reducing agent is preferably higher than the boiling point of a liquid medium, which will be described later. By using a solid reducing agent having such physical properties, the reducing agent melts and spreads uniformly in the bonding films 3 during heating of the bonding films 3, to thereby uniformly facilitate sintering of the copper particles, and thus a denser sintered structure can be obtained. As a result, it is possible to obtain a bonded structure that has both of improved thermal conductivity and electro-conductivity and also has excellent heat resistance.

In addition, the solid reducing agent remains in the form of a solid in the bonding films 3 before heating, and thus the shape retention of the bonding films 3 can be enhanced. As a result, even when the bonding films 3 are pressed during heating of the bonding films 3, each of the bonding films 3 is unlikely to protrude from between the bonding target 5 and the copper foil 2. Accordingly, thickness control can be performed more easily, and thus it is possible to obtain a bonded structure having a large bonding strength.

Since the bonding sheet 1 as described above includes the bonding films 3 containing a solid reducing agent, the copper particles are sufficiently sintered during heating of the bonding sheet 1 with the bonding targets 5, to thereby form a dense sintered structures. As a result, it is possible to obtain a sintered structure that has both of improved thermal conductivity and improved electrical conduction reliability between the copper foil 2 and each of the bonded objects (bonding targets 5). In addition, the sintered structure obtained has a large bonding strength between the copper foil 2 and each of the bonded objects (bonding targets 5).

Also, each of the copper foil 2 and the bonding films 3 contains copper, and thus in the case where the bonding sheet 1 is used in a process for producing a power module, they can be bonded without the need for separately performing a surface treatment step, such as metallization, for enhancing the bonding strength. Accordingly, it is possible to obtain a power module that has a large bonding strength and also exhibits thermal conductivity and electrical conduction reliability at high levels.

In view of achieving both of high thermal conductivity and electrical conduction reliability in the sintered structure, each of the bonding films 3 contains, as the solid reducing agent, preferably an amino alcohol compound, and more preferably an amino alcohol compound represented by the following chemical formula (1) or (2). As used herein, the term "amino alcohol compound" refers to an organic compound that contains at least one amine selected from a primary amine, a secondary amine, and a tertiary amine and at least one alcohol selected from a primary alcohol, a secondary alcohol, and a tertiary alcohol within one chemical structure.

[Chem. 2]

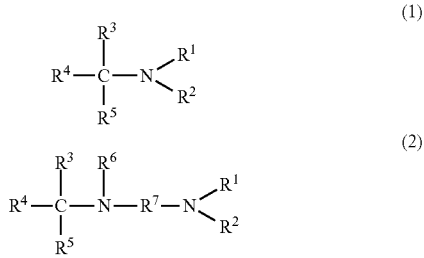

In the chemical formula (1) or (2), $R^1$ to $R^6$ each independently represent a hydrogen atom, a hydroxyl group, a hydrocarbon group having 1 to 10 carbon atoms, or a hydrocarbon group having 1 to 10 carbon atoms and a hydroxyl group. The hydrocarbon group may be a saturated or unsaturated aliphatic group. The aliphatic group may be in the form of a linear chain or a branched chain. Examples of the hydrocarbon group represented by each of $R^1$ to $R^6$ include a methyl group, an ethyl group, and a propyl group.

In the formula (2), $R^7$ represents a hydrocarbon group having 1 to 10 carbon atoms, or a hydrocarbon group having 1 to 10 carbon atoms and a hydroxyl group. The hydrocarbon group may be a saturated or unsaturated aliphatic group. The aliphatic group may be in the form of a linear chain or a branched chain. Examples of the hydrocarbon group represented by $R^7$ include a methylene group, an ethylene group, a propylene group, and a butylene group.

In view of enhancing the sinterability between copper particles, at least two of $R^1$ to $R^5$ in the chemical formula (1) contain a hydroxyl group. That is, at least two of $R^1$ to $R^5$ represent a hydroxyl group or a hydrocarbon group having 1 to 10 carbon atoms and a hydroxyl group. In the formula (2), at least two of $R^1$ to $R^6$ contain a hydroxyl group. That is, at least two of $R^1$ to $R^6$ represent a hydroxyl group or a hydrocarbon group having 1 to 10 carbon atoms and a hydroxyl group. In particular, at least two of $R^1$ to $R^5$ in the chemical formula (1) preferably represent a hydrocarbon group having 1 to 4 carbon atoms and a hydroxyl group. In the chemical formula (2), at least two of $R^1$ to $R^6$ preferably represent a hydrocarbon group having 1 to 4 carbon atoms and a hydroxyl group. In these cases, the hydroxyl group in the hydroxyalkyl group is preferably bonded to the terminal of the alkyl group.

In the reducing agent represented by the chemical formula (1), it is preferable that three or more of $R^1$ to $R^5$ contain a hydroxyl group, it is more preferable that four or more of $R^1$ to $R^5$ contain a hydroxyl group, and it is even more preferable that all of $R^1$ to $R^5$ contain a hydroxyl group, in view of enhancing the sinterability between copper particles. From the same viewpoint, in the reducing agent represented by the chemical formula (2), it is preferable that three or more of $R^1$ to $R^6$ contain a hydroxyl group, and it is more preferable that four or more of $R^1$ to $R^6$ contain a hydroxyl group.

Specific examples of the amino alcohol compound represented by the chemical formula (1) or (2) include bis(2-hydroxyethyl)iminotris(hydroxymethyl)methane (BIS-TRIS, melting point: 104° C., boiling point: above 300° C., corresponding to the chemical formula (1)), 2-amino-2-(hydroxymethyl)-1,3-propanediol (TRIS, melting point: 169 to 173° C., boiling point: above 300° C., corresponding to the chemical formula (1)), and 1,3-bis(tris(hydroxymethyl)methylamino)propane (BIS-TRIS propane, melting point: 164 to 165° C., boiling point: above 300° C., corresponding to the chemical formula (2)). Out of these, bis(2-hydroxyethyl)iminotris(hydroxymethyl)methane (BIS-TRIS) is preferably used as the solid reducing agent, in view of enhancing the sinterability between copper particles to obtain a bonded structure including a dense bonding layer.

The solid reducing agents listed above can be used singly or in a combination of two or more. In either case, in view of enhancing the sinterability between copper particles, the content of the solid reducing agent in each of the bonding films is preferably 0.1 parts by mass or more, and more preferably 1 part by mass or more, relative to 100 parts by mass of the copper particles. Also, in view of exhibiting a favorable application performance to the copper foil while keeping a certain content of copper particles in the bonding composition, it is practical to set the content of the solid reducing agent to 10 parts by mass or less, preferably 8 parts by mass or less, and more preferably 5 parts by mass or less.

The bonding films 3 may further contain a liquid medium that has a boiling point of less than 300° C. as measured at 1 atm pressure. The liquid medium is used to enhance ease of formation of the bonding films 3 when forming the bonding films 3. From this viewpoint, the liquid medium is preferably in the form of a liquid at 1 atm pressure and room temperature (25° C.).

In the case where the bonding films contain a liquid medium, the liquid medium is preferably a non-aqueous medium, in view of suppressing oxidation of the copper particles.

In view of both ease of formation of the bonding films and an appropriate volatility of the liquid medium, the liquid medium is preferably a monohydric alcohol or a polyhydric alcohol, and more preferably a polyhydric alcohol. Examples of the polyhydric alcohol include propylene glycol (boiling point: 188° C.), ethylene glycol (boiling point: 197° C.), hexylene glycol (boiling point: 197° C.), diethylene glycol (boiling point: 245° C.), 1,3-butanediol (boiling point: 207° C.), 1,4-butanediol (boiling point: 228° C.), dipropylene glycol (boiling point: 231° C.), tripropylene glycol (boiling point: 273° C.), glycerin (boiling point: 290° C.), polyethylene glycol 200 (boiling point: 250° C.), and polyethylene glycol 300 (boiling point: 250° C.). The liquid media can be used singly or in a combination of two or more. Out of these, the liquid medium preferably contains one or more selected from the group consisting of hexylene glycol and polyethylene glycols such as polyethylene glycol 200 and polyethylene glycol 300, in view of enhancing the shape retention of the bonding films 3, and enhancing the dispersibility of components in the bonding films 3 to obtain a uniform and dense sintered structure.

In the case where the bonding films contain a liquid medium, the amount of the liquid medium in each of the bonding films is preferably 9 parts by mass or less, and more preferably 7 parts by mass or less, relative to 100 parts by mass of the copper particles, in view of enhancing the shape retention of the bonding films. In the case where the bonding sheet is produced using, for example, a production method described later, coating films and bonding films 3, which are dried films obtained by drying the coating films, contain substantially the same amounts of constituent materials other than the liquid medium, and thus the content of the liquid medium in each of the bonding films can be calculated by measuring the change in the mass of the coating film before and after drying, for example.

The shape of the copper particles contained in the bonding films 3 may be, for example, a spherical shape, a flat (flaky) shape, a dendritic shape (tree-like shape), a rod-like shape, or the like, and the copper particles having any of these shapes can be used singly or in a combination of two or more. The shape of the copper particles varies depending on the production method of the copper particles. For example, spherical particles can be easily obtained when a wet reduction method or an atomizing method is used as the production method of the copper particles. Dendritic or rod-like particles can be easily obtained when an electrolysis reduction method is used. Flat particles can be obtained by, for example, applying a mechanical external force to spherical particles to plastically deform the spherical particles.

The copper particles preferably have a spherical shape. In this case, the particle size of the spherical copper particles can be determined by analyzing an image captured with a scanning electron microscope. Specifically, image data of copper particles acquired with a scanning electron microscope is read using Mac-View available from Mountech Co., Ltd. 50 or more copper particles are randomly selected from among the copper particles on the image data, and the particle size (Heywood diameter) of each of the selected particles, the area S of each of the selected particles in the two-dimensional projection image, and the perimeter length L of each of the selected particles in the two-dimensional projection image are measured. Next, the volume of each of the selected particles is calculated from the obtained Heywood diameters assuming that the particles have a perfect spherical shape, and the 50th percentile of the particle size on a volume basis is used as $D_{SEM50}$.

Whether or not the copper particles have a spherical shape can be determined in the following manner. For each of the particles randomly selected using the above-described method, the circularity coefficient $4\pi S/L^2$ is calculated from the area S and the perimeter length L thereof, and the arithmetic average value of the circularity coefficients is then calculated. When the arithmetic average value of the circularity coefficients is 0.85 or more, in particular, 0.90 or more, it is determined that the copper particles have a spherical shape.

The particle size of the spherical copper particles is preferably 30 nm or more and 200 nm or less, and more preferably 40 nm or more and 180 nm or less, in terms of the particle size $D_{SEM50}$ described above. In the case where the particle size is within such a range, dense sintered structures can be formed when bonding the copper foil and the bonding targets, and, as a result, it is possible to cause a resulting bonded structure including the bonding sheet to exhibit the thermal conductivity, heat resistance, and bonding strength at high levels. In addition, a dense sintered structure can be formed even in a relatively low-temperature sintering condition, and thus a bonded structure that gives the desired performance can be obtained while excessive heat loads on the bonding targets during production is avoided.

It is also preferable that the copper particles contain flat copper particles. In this case, the flat copper particles has a 50th percentile of the particle size on a volume basis, $D_{50}$, of preferably 0.3 µm or more and 100 µm or less, more preferably 0.5 µm or more and 70 µm or less, and even more preferably 0.7 µm or more and 50 µm or less, as determined by laser diffraction scattering particle size distribution analysis. In the case where particles having a particle size within the above-described range are contained, it is possible to cause a resulting bonded structure including the bonding sheet to exhibit both of high thermal conductivity and electrical conduction reliability, and also to exhibit heat resistance and a large bonding strength. In addition, a dense sintered structure can be formed even in a relatively low-temperature sintering condition. As used herein, the term "flat" refers to a shape including a pair of planar surfaces, which serve the major surfaces of a particle, and a side surface, which intersects the planar surfaces, and the planar surfaces and the side surface may each independently be a plane, a curved surface, or an uneven surface.

The particle size $D_{50}$ can be measured in the following manner. For example, 0.1 g of a measurement sample and 50 mL of pure water are mixed, and the mixture is dispersed for 1 minute using an ultrasonic homogenizer (US-300T available from Nihonseiki Kaisha, Ltd.). After that, a particle size distribution is determined using a laser diffraction scattering particle size distribution analyzer, for example, MT 3300 EX II available from Microtrac BEL Corporation.

In the case where the copper particles contain flat copper particles, the flat copper particles have a ratio of the length of the major axis to the length of the minor axis (hereinafter also referred to as "aspect ratio") of the planar surfaces of preferably 2 or more and 80 or less, and more preferably 5 or more and 40 or less. When particles having such a shape are further contained, a densely sintered bonding layer can be formed to improve the thermal conductivity and the electrical conduction reliability.

The lengths of the major axis and the minor axis of the flat copper particles are determined in the following manner. Specifically, a particle as the measurement target is observed using a scanning electron microscope while it is rotated 360 degrees in a direction horizontal to the planar surfaces of the particle. At this time, two-dimensional projection images of the particle are obtained while rotating. Among the two-dimensional projection images, one in which the side of the imaginary circumscribed rectangle thereof is longest is selected. The long side and the short side of the circumscribed rectangle of the selected two-dimensional projection image are used as the major axis and the minor axis, respectively. 50 or more flat copper particles are randomly selected in the same manner as described above, and the major axis and the minor axis of each of the selected particles are determined. Then the arithmetic average value of the lengths of the major axis of the selected particles and that of the minor axis are determined.

Next a method for producing a bonding sheet 1 described above will be described. For example, the method for producing the bonding sheet 1 may include: the step of applying a bonding composition onto both faces of a copper foil 2 to form coating films (the application step); and the step of drying the coating films to form dried coating films as bonding films 3 (the dried coating film-forming step).

For the method for producing the bonding sheet 1, the following method (a) may be used, for example.

(a) In the first application step, a bonding composition is applied onto one face of the copper foil 2 to form a coating film, and thereafter the first dried coating film-forming step is performed; next, in the second application step, the bonding composition is applied onto the other face of the copper foil 2 to form another coating film, and thereafter the second dried coating film-forming step is performed.

Instead of the method (a), the following method (b) may be used:

(b) a bonding composition is applied onto both faces of the copper foil 2 to form coating films, and a dried coating film-forming step is performed.

The description given below also applies to both of the methods (a) and (b).

First, a bonding composition containing copper particles and a solid reducing agent is applied to the face(s) of a copper foil 2 to form coating films. There is no particular limitation on the means to apply the bonding composition, and any known application means can be used, including screen printing, dispense printing, gravure printing, and offset printing. In view of efficiently applying the bonding composition, the bonding composition is preferably a paste or ink containing a liquid medium. The bonding composition can be obtained by mixing copper particles and a solid reducing agent described above, and optionally a liquid medium described above.

In view of obtaining bonding films exhibiting high level shape retention and forming a bonded structure exhibiting the thermal conductivity and electrical conduction reliability in a stable manner, the thickness of the formed coating films immediately after application is preferably 1 μm or more and 1000 μm or less, and more preferably 5 μm or more and 700 μm or less.

In the case where the bonding composition contains a liquid medium, the amount of the liquid medium in the bonding composition is preferably 40 parts by mass or less, and more preferably 35 parts by mass or less, relative to 100 parts by mass of the copper particles, in view of imparting an appropriate viscosity to the bonding composition and enhancing the shape retention of the coating films when the bonding composition is applied to the copper foil. The amount of the liquid medium in the bonding composition is preferably 10 parts by mass or more.

In view of enhancing ease of application of the coating on the copper foil and the shape retention of the coating films, the viscosity of the bonding composition is preferably 20 Pa·s or more and 200 Pa·s or less, and more preferably 25 Pa·s or more and 180 Pa·s or less, as measured at a shear rate of $10\ s^{-1}$ and a temperature of 25° C. without any thermal history. The viscosity of the bonding composition can be measured using a rheometer (apparatus for measuring the viscoelasticity) with a parallel plate sensor.

The bonding composition may contain additional components as long as the advantageous effects of the present invention are exhibited. Examples of the additional components include a binder component, a surface tension modifier, an anti-foaming agent, and a viscosity modifier. The total amount of the additional components is preferably 0.1 parts by mass or more and 10 parts by mass or less relative to 100 parts by mass of the copper particles.

Next, the coating films formed on the faces of the copper foil are dried to obtain a bonding sheet 1 including the bonding films 3 and the copper foil 2. In this step, the coating films are dried to remove at least a portion of the liquid medium from the coating films to form, on the faces of the copper foil 2, the bonding films 3 containing a reduced amount of the liquid medium compared to the coating films. By removing the liquid medium from the coating films, the shape retention of the bonding films 3 can be further enhanced. Furthermore, removing the liquid medium can enhance the adhesion of bonding layers 30 when the bonding sheet 1 including the copper foil 2 and the bonding films 3 is bonded to bonding targets 5 through heating, and thus both thermal conductivity and electrical conduction reliability can be enhanced to high levels. As described above, in each of the bonding films 3, the content of the liquid medium is preferably 9 parts by mass or less relative to 100 parts by mass of the copper particles. In this step, the coating films and the bonding films 3, which are dried films formed by drying the coating films, contain substantially the same amounts of constituent materials other than the liquid medium. Also, the copper particles in the bonding films are not fused to each other, and thus the bonding films formed in this step are sinterable.

In order to remove the liquid medium by drying, a drying method that utilizes the volatility of the liquid medium, such as natural air drying, hot air drying, infrared radiation, or hot plate drying, may be used to volatilize the liquid medium. This step can be modified as appropriate according to the formulation of the bonding composition used, but is preferably performed at a temperature less than the melting point of the copper particles. For example, this step can be performed in an atmosphere at a temperature of 60° C. or more and 150° C. or less and an atmospheric pressure for 1 minute or more and 30 minutes or less.

In view of enhancing the adhesion to bonding targets 5 to obtain a bonded structure 10 having excellent thermal conductivity and electrical conduction reliability, the bonding films 3 each have a thickness of preferably 0.5 μm or more, and more preferably 3 μm or more. Also, in view of saving the space for electronic components, the bonding films 3 each have a thickness of preferably 980 μm or less, and more preferably 600 μm or less. The thickness of the bonding films 3 can be adjusted by, for example, adjusting the thickness of the coating films formed in the above-described step as appropriate. The thickness of each of the bonding films 3 can be measured by, for example, observing a cross section of the bonding sheet 1 in the thickness direction with a scanning electron microscope.

Next, a method for producing a bonded structure 10 will be described. In one embodiment, a bonding sheet 1 or bonding sheets 1 obtained through the above-described steps and bonding targets 5 may be bonded together to obtain a bonded structure 10 configured as shown in FIG. 2(a) or 2(b). In a bonded structure 10 according to the present embodiment, the first bonded object 51 having at least one metal selected from gold, silver, copper, and nickel on a surface thereof and the second bonded object 52 having at least one metal selected from gold, silver, copper, and nickel on a surface thereof are electrically connected via a bonding layer 30 having a sintered structure of the copper particles.

Examples of the bonding targets 5 for the bonded structure 10 include spacers or heat dissipation plates made of a metal such as gold, silver, or copper, semiconductor elements, and substrates having at least one metal selected from gold, silver, copper, and nickel on a surface thereof. As the substrates, for example, insulating substrates can be used that have copper on the surfaces of a ceramic or aluminum nitride plate, such as DBC (Direct Bonded Copper) substrates.

In the production process of a bonded structure 10, a bonding sheet 1 is first obtained through the above-described steps. Then, as shown in FIG. 2(a) or 2(b), each of the bonding films 3 of the bonding sheet 1 is disposed so as to face a bonding target 5 to obtain a stack 10A in which each of the bonding films 3 is positioned between the bonding target 5 and the copper foil 2 of the bonding sheet 1.

In the embodiment shown in FIG. 2(a), the stack 10A is configured such that the first face 1A, which is a surface where a bonding film 3 is present, of the bonding sheet 1 and the first target object to be bonded (first bonding target) 51 are in surface contact with each other. In addition, the stack 10A is configured such the second face 1B, which is a surface where a bonding film 3 is present, of the bonding sheet 1 and the second target object to be bonded (second bonding target) 52 are in surface contact with each other.

In other words, in the stack 10A shown in FIG. 2(a), the bonding sheet 1 is interposed between the first bonding target 51 and the second bonding target 52. In the stack 10A thus formed, the bonding films 3 are in an unsintered state.

In the embodiment shown in FIG. 2(b), the stack 10A is configured such that the first face 1A, which is a surface where a bonding film 3 is present, of the first bonding sheet 1S and the first target object to be bonded (first bonding target) 51 are in surface contact with each other. In addition, the stack 10A is configured such that the second face 1B, which is a surface where a bonding film 3 is present, of the first bonding sheet 1S and the third target object to be bonded (third bonding target) 53 are in surface contact with each other.

Furthermore, the stack 10A is configured such that the first face 1C, which is a surface where a bonding film 3 is present, of the second bonding sheet 1T and the third bonding target 53 are in surface contact with each other. In addition, the stack 10A is configured such that the second face 1D, which is a surface where a bonding film 3 is present, of the second bonding sheet 1T and the second target object to be bonded (second bonding target) 52 are in surface contact with each other.

In other words, in the stack 10A shown in FIG. 2(b), the third bonding target 53 is interposed between the first bonding target 51 and the second bonding target 52, the bonding sheet 1S is interposed between the first bonding target 51 and the third bonding target 53, and the bonding sheet 1T is interposed between the second bonding target 52 and the third bonding target 53. In the present embodiment as well, the bonding films 3 in the stack 10A thus formed are in an unsintered state.

As the bonding targets 5 of the stack 10A, those described for the bonding targets 5 of the bonded structure 10 can be used. In the embodiment shown in FIG. 2(b), the third bonding target 53 is preferably a semiconductor element, or a substrate having at least one metal selected from gold, silver, copper, and nickel on a surface thereof.

Next, the stack 10A is heated to sinter the copper particles contained in the bonding films 3 to thereby form bonding layers 30 for bonding the bonding targets 5 and the copper foil 2.

The sintering atmosphere is preferably an inert gas atmosphere such as nitrogen.

The sintering temperature is preferably less than 300° C., more preferably 150° C. or more and less than 300° C., even more preferably 200° C. or more and less than 300° C., and yet even more preferably 230° C. or more and less than 300° C.

The sintering time is preferably 30 minutes or less, more preferably 0.5 minutes or more and 25 minutes or less, and even more preferably 1 minute or more and 20 minutes or less, in the case where the sintering temperature is within the above-described range.

Sintering is preferably performed under pressure. The pressure applied to the bonding films at this time is preferably 0.001 MPa or more, more preferably 0.001 MPa or more and 20 MPa or less, and even more preferably 0.01 MPa or more and 15 MPa or less.

The bonding layers 30 obtained through the above-described steps have a sintered structure of the copper particles contained in the bonding films 3. That is, the bonding layers 30 include a sintered product of the copper particles contained in the bonding films 3, and are formed as a result of sintering the bonding films 3.

When the stack 10A according to the embodiment shown in FIG. 2(a) is heated for sintering, the copper particles contained in each of the bonding films 3 are sintered, and the area where the bonding sheet 1 is present turns into a composite bonding layer 1L including a copper foil 2 and bonding layers 30 formed on both faces of the copper foil 2. Accordingly, in the bonded structure 10 obtained by heating the stack 10A according to the embodiment shown in FIG. 2(a), the first bonded object 51 and the second bonded object 52 are electrically connected via the composite bonding layer 1L including a copper foil 2 and bonding layers 30 formed on both faces of the copper foil 2.

When the stack 10A according to the embodiment shown in FIG. 2(b) is heated for sintering, the copper particles contained in each of the bonding films 3 are sintered, and the bonding sheet 1S and the bonding sheet 1T respectively turn into composite bonding layers 1L each including a copper foil 2 and bonding layers 30 formed on both faces of the copper foil 2. Accordingly, in the bonded structure 10 obtained by heating the stack 10A according to the embodiment shown in FIG. 2(b), the first bonded object 51 and the third bonded object 53 are electrically connected via one of the composite bonding layers 1L, and the second bonded object 52 and the third bonded object 53 are electrically connected via the other composite bonding layer 1L.

As described hereinabove, a solid reducing agent represented by the chemical formula (1) or (2) given above may be contained in the bonding films 3. In this case, when the stacks 10A according to the embodiments shown in FIGS. 2(a) and 2(b) are heated for sintering, a structure (3) shown below, which is derived from the copper contained in the copper particles and the solid reducing agent, is formed in each of the bonding layers 30.

[Chem. 3]

(3)

In the formula, $R^3$ to $R^5$ each independently represent a hydrogen atom, a hydroxyl group, a hydrocarbon group having 1 to 10 carbon atoms, or a hydrocarbon group having 1 to 10 carbon atoms and a hydroxyl group. For details of $R^3$ to $R^5$, reference is made to the description of the chemical formulas (1) and (2) given above as appropriate. The symbol "*" indicates a linkage site to copper.

Whether the structure (3) is formed in the bonding layer 30 can be checked by TOF-SIMS mass spectrometry or the like on a cross section of the bonding layer. For example, in the case where BIS-TRIS is used as a solid reducing agent, a fragment for a molecular weight of 152 assigned to C—N(Cu)$_2$ is exhibited on the positive electrode side in the TOF-SIMS mass spectrum.

The thickness of the bonding layers 30 is preferably adjusted such that the copper foil and the bonding targets are reliably bonded, and such that sufficiently high electroconductivity and thermal conductivity are obtained. Specifically, each of the bonding layer 30 has a thickness of preferably 0.1 μm or more and 950 μm or less, and more preferably 1 μm or more and 500 μm or less. In the production process of the bonding layers 30, the liquid medium in the bonding films 3 may be removed, and thus the thickness of the bonding layers 30 may be the same as or thinner than the thickness of the bonding films 3.

The thickness of the bonding layers 30 can be controlled as appropriate by adjusting, for example, the thickness of the films formed by using a bonding composition described above, the thickness of the bonding films 3, and the pressure condition during heating. Also, the thickness of each of the bonding layers 30 is measured by embedding the bonding layer in resin, polishing the resultant, and observing the polished surface with an electron microscope.

The above-described bonding sheet 1 and the above-described bonded structure 10 including bonding layers 30 are preferably used in a high-temperature environment, and specifically, for example, in an in-vehicle electronic circuit or an electronic circuit on which a power device is mounted, by exploiting high thermal conductivity and electrical conduction reliability of the bonding sheet 1 and the bonded structure 10.

The bonded structure 10 is favorably used as a power module structure. The power module structure may be configured such that a plurality of bonded structures 10 are electrically connected to electrodes of a lead frame or the like via metal wire made of gold, copper, or the like. One or more metal wires are provided on the bonded object (bonding target 5), such as a semiconductor element or a substrate having a metal such as copper on a surface thereof, so as to electrically connect the bonded structures 10 and the electrodes.

An example of a power module structure will be described with reference to FIG. 2(b). A semiconductor element is used as the first bonding target (first bonded object) 51, a heat dissipation plate made of a metal such as copper is used as the second bonding target (second bonded object) 52, and a DBC substrate is used as the third bonding target (third bonded object) 53. In the resulting bonded structure 10, a composite bonding layer 1L, which is a sintered product of a bonding sheet 1, may be present between the two bonded objects 51 and 52 and/or between the two bonded objects 51 and 53.

The present invention has been described above based on preferred embodiments thereof, but the present invention is not limited to the embodiments given above. For example, in the bonded structure 10 obtained by heating the stack 10A according to the embodiment shown in FIG. 2(b), a composite bonding layer 1L is present between the bonded objects 51 and 53 and also another composite bonding layer 1L is present between the bonded objects 52 and 53. However, the present invention is not limited to this configuration. Specifically, for example, only a bonding layer 30 may be present between the bonded objects 52 and 53 while a composite bonding layer 1L is present between the bonded objects 51 and 53. Alternatively, only a bonding layer 30 may be present between the bonded objects 51 and 53 while a composite bonding layer 1L is present between the bonded objects 52 and 53.

Figure 3:
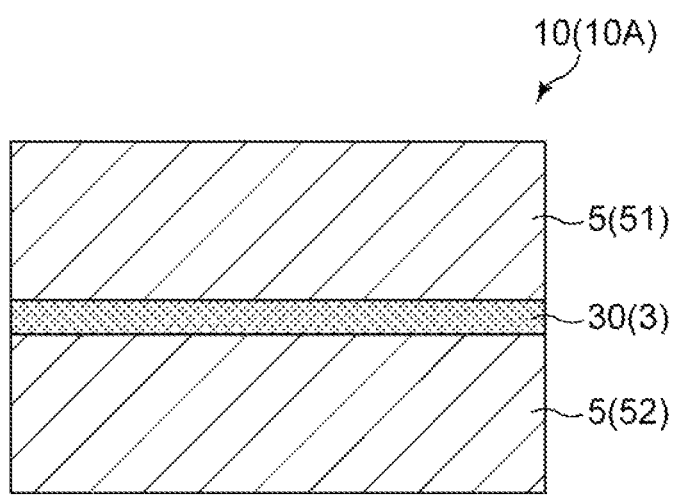
FIG. 3 is a side view schematically illustrating a bonded structure according to still another embodiment.

As shown in FIG. 3, only a bonding layer 30 may be present between two bonded objects 5 in a bonded structure 10. Such a bonded structure 10 may be produced by the following method, for example: a bonding composition is applied to a first target object to be bonded 51 to form a coating film; the coating film is dried to obtain a bonding film 3; after that, a second target object to be bonded 52 is disposed on the bonding film 3; and the bonding film 3 with the bonding targets 51 and 52 is heated for sintering to bond them together, to thereby obtain the bonded structure 10. In this embodiment, the bonded objects (bonding targets 51 and 52) are electrically connected via the bonding layer 30 alone. In this embodiment, only a bonding film 3 that will serve as a bonding layer 30 may be formed so as to have required minimum dimensions, and accordingly, as compared with a case where the bonding sheet 1 is used, this embodiment is advantageous in that it is unnecessary to perform post-processing, such as removing an excess bonding layer 30 (or an excess bonding film 3) formed in the production process. For the bonding composition, the bonding film 3, the bonding targets 5, and the bonding layer 30, reference is made to the description of the embodiments given above as appropriate.

For the purpose of, for example, protection against corrosion, at least one face of the copper foil 2 may be surface-treated with an organic compound such as benzotriazole as long as the advantageous effects of the present invention are not impaired.

INDUSTRIAL APPLICABILITY

According to the present invention, provide are a bonding sheet and a bonded structure excellent in the thermal conductivity and electrical conduction reliability.

The invention claimed is:

1. A bonding sheet comprising:
a copper foil containing copper in an amount of 97 mass % or more; and
sinterable bonding films formed on both faces of the copper foil,
wherein each of the bonding films contains copper particles and a solid reducing agent, and
the bonding sheet is used such that at least one of the bonding films is bonded to a target object, the target object having at least one metal selected from gold, silver, copper, and nickel on a surface thereof.

2. The bonding sheet according to claim 1,
wherein the bonding sheet is used so as to bond the target objects to the both faces of the bonding films, respectively.

3. The bonding sheet according to claim 1,
wherein the solid reducing agent is an amino alcohol compound.

4. The bonding sheet according to claim 1,
wherein the copper foil has a thickness of 0.5 μm or more and 1000 μm or less.

5. A bonded structure comprising:
a first bonded object having at least one metal selected from gold, silver, copper, and nickel on a surface thereof;
a second bonded object having at least one metal selected from gold, silver, copper, and nickel on a surface thereof, and
a composite bonding layer including,
a copper foil, and
bonding layers formed on both faces of the copper foil, each of the bonding layers including a sintered structure of copper particles, the first bonded object and the second bonded object being electrically connected via the composite bonding layer;
wherein a structure (3) below is formed in each of the bonding layers, [Chem. 1]

[Chem. 1]

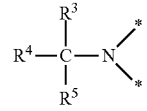

(3)

where $R^3$ to $R^5$ each independently represent a hydrogen atom, a hydroxyl group, a hydrocarbon group having 1 to 10 carbon atoms, or a hydrocarbon group having 1 to 10 carbon atoms and a hydroxyl group, and * represents a linkage site to copper.

6. The bonded structure according to claim 5, further comprising a third bonded object interposed between the first bonded object and the second bonded object,
   wherein electrical connection between the first bonded object and the third bonded object and electrical connection between the second bonded object and the third bonded object are respectively obtained via the bonding layer or via the composite bonding layer, and
   the third bonded object is a semiconductor element, or a substrate having at least one metal selected from gold, silver, copper, and nickel on a surface thereof.

7. The bonded structure according to claim 5,
   wherein the copper foil contains copper in an amount of 97 mass % or more.

* * * * *